United States Patent [19]

Banerjee

[11] Patent Number: 5,109,259
[45] Date of Patent: Apr. 28, 1992

[54] MULTIPLE DRAM CELLS IN A TRENCH

[75] Inventor: Sanjay K. Banerjee, Richardson, Tex.

[73] Assignee: Texas Instruments Incorporated, Dallas, Tex.

[21] Appl. No.: 651,106

[22] Filed: Feb. 4, 1991

Related U.S. Application Data

[63] Continuation of Ser. No. 405,085, Sep. 6, 1989, abandoned, which is a continuation of Ser. No. 99,588, Sep. 22, 1987, abandoned.

[51] Int. Cl.$^5$ .......................................... H01L 27/108
[52] U.S. Cl. ........................................ 357/23.6; 357/55
[58] Field of Search .............................. 357/23.6, 55

[56] References Cited

U.S. PATENT DOCUMENTS

| | | | |
|---|---|---|---|
| 3,961,355 | 6/1976 | Abbas et al. | 357/23.6 |
| 4,003,036 | 1/1977 | Jenne | 365/149 |
| 4,017,885 | 4/1977 | Kendall et al. | 357/51 |
| 4,105,475 | 8/1978 | Jenne | 357/23.6 |
| 4,115,795 | 9/1978 | Masuoka et al. | 357/23.6 |
| 4,116,720 | 9/1978 | Vinson | 357/23.6 |
| 4,164,751 | 8/1979 | Tasch, Jr. | 357/23.6 |
| 4,199,772 | 4/1980 | Natori et al. | 357/23.6 |
| 4,225,945 | 9/1980 | Kuo | 365/149 |
| 4,262,296 | 4/1981 | Shealy et al. | 357/55 |
| 4,319,342 | 3/1982 | Scheuerlein | 365/149 |
| 4,327,476 | 5/1982 | Iwai et al. | 357/23.6 |
| 4,353,086 | 10/1982 | Jaccodine et al. | 357/51 |
| 4,364,074 | 12/1982 | Garnache et al. | 357/23.6 |
| 4,369,564 | 1/1983 | Hiltpold | 357/23.6 |
| 4,397,075 | 8/1983 | Fatula, Jr. et al. | 357/23.6 |
| 4,412,237 | 10/1983 | Matsumura et al. | 357/42 |
| 4,432,006 | 2/1984 | Takei | 357/23.6 |
| 4,434,433 | 2/1984 | Nishizawa | 357/22 |
| 4,462,040 | 7/1984 | Ho et al. | 357/23.6 |
| 4,472,240 | 9/1984 | Kameyama | 357/50 |
| 4,476,623 | 10/1984 | El-Kareh | 357/50 |
| 4,536,785 | 8/1985 | Gibbons | 357/23.6 |
| 4,568,958 | 2/1986 | Baliga | 357/23.4 |
| 4,630,088 | 12/1986 | Ogura et al. | 357/23.6 |
| 4,636,281 | 1/1987 | Buiguez et al. | 156/643 |
| 4,649,625 | 3/1987 | Lu | 357/23.6 |
| 4,650,544 | 3/1987 | Erb et al. | 357/23.6 |
| 4,651,184 | 3/1987 | Malhi | 357/23.6 |
| 4,670,768 | 6/1987 | Sumani et al. | 357/42 |
| 4,672,410 | 6/1987 | Miura et al. | 357/23.6 |
| 4,673,962 | 6/1987 | Chatterjee et al. | 357/23.6 |
| 4,683,486 | 7/1987 | Chatterjee | 357/23.6 |
| 4,686,552 | 8/1987 | Teng et al. | 357/23.6 |
| 4,702,795 | 10/1987 | Douglas | 357/23.6 |
| 4,704,368 | 11/1987 | Goth et al. | 437/60 |
| 4,713,678 | 12/1987 | Womack et al. | 357/23.6 |
| 4,717,942 | 1/1988 | Nakamura et al. | 357/23.6 |
| 4,751,557 | 6/1988 | Sunami et al. | 357/23.6 |
| 4,751,558 | 6/1988 | Kenney | 357/23.6 |
| 4,769,786 | 9/1988 | Garnache et al. | 357/23.6 |

FOREIGN PATENT DOCUMENTS

| | | | |
|---|---|---|---|
| 66081 | 12/1982 | European Pat. Off. | |
| 88451 | 9/1983 | European Pat. Off. | 357/23.6 |
| 108390 | 5/1984 | European Pat. Off. | |
| 118878 | 9/1984 | European Pat. Off. | |

(List continued on next page.)

OTHER PUBLICATIONS

Jambotkar; IBM TDB, vol. 27, No. 2, Jul. 1984, pp. 1313-1320.

Clarke et al., IBM TDB, vol. 17, No. 9, Feb. 1975, pp. 2579-2580.

(List continued on next page.)

*Primary Examiner*—William D. Larkins
*Attorney, Agent, or Firm*—Ira S. Matsil; James C. Kesterson; Richard L. Donaldson

[57] ABSTRACT

A multiple DRAM cell trench structure provides increased cell capacitance. A deep trench (18) is formed in a P+ semiconductor substrate (10), with sufficient trench width to prevent the tapered trench sidewalls from pinching off at the bottom thereof. Plural memory cells are formed in the trench (18) to increase the cell density of the array. Field oxide strips (14, 15) are formed between conductive polysilicon bitlines (16, 38) and the P− substrate (12) to reduce capacitance and the soft error rate of the cells.

17 Claims, 3 Drawing Sheets

FOREIGN PATENT DOCUMENTS

| | | |
|---|---|---|
| 167764 | 1/1986 | European Pat. Off. . |
| 176254 | 4/1986 | European Pat. Off. . |
| 186875 | 7/1986 | European Pat. Off. . |
| 198590 | 10/1986 | European Pat. Off. . |
| 2706155 | 8/1978 | Fed. Rep. of Germany . |
| 3508996 | 10/1985 | Fed. Rep. of Germany . |
| 3525418A1 | 1/1986 | Fed. Rep. of Germany . |
| 51-130176 | 11/1976 | Japan .................................. 357/23.6 |
| 55-11365 | 1/1980 | Japan . |
| 55-133574 | 10/1980 | Japan . |
| 56-51854 | 5/1981 | Japan . |
| 57-10973 | 1/1982 | Japan . |
| 57-109367 | 7/1982 | Japan .................................. 357/23.7 |
| 58-3269 | 1/1983 | Japan . |
| 58-10861 | 1/1983 | Japan . |
| 58-204568 | 11/1983 | Japan . |
| 58-213464 | 12/1983 | Japan . |
| 59-19366 | 1/1984 | Japan .................................. 357/23.6 |
| 59-103373 | 6/1984 | Japan .................................. 357/23.6 |
| 59-141262 | 8/1984 | Japan . |
| 59-181661 | 10/1984 | Japan . |
| 60-12752 | 1/1985 | Japan . |
| 60-182161 | 9/1985 | Japan . |
| 60-213053 | 10/1985 | Japan . |
| 60-261165 | 12/1985 | Japan . |
| 61-36965 | 2/1986 | Japan . |
| 61-73366 | 4/1986 | Japan . |
| 1084937 | 9/1967 | United Kingdom ............... 357/23.4 |
| 2002958 | 2/1979 | United Kingdom . |
| 2168195A | 12/1985 | United Kingdom . |

OTHER PUBLICATIONS

Chang et al., IBM TDB, vol. 22, No. 8B, Jan. 1980, pp. 3683–3687.

Kenney, IBM TDB, vol. 23, No. 9, Feb. 1981, pp. 4052–4053.

Fatula et al., IBM TDB, vol. 22, No. 8A, Jan. 1980, pp. 3204–3205.

Chang et al., IBM TDB, vol. 22, No. 7, Dec. 1979, pp. 2768–2771.

Barson, IBM TDB, vol. 21, No. 7, Dec. 1978, pp. 2755–2756.

Kenney, IBM TDB, vol. 23, No. 3, Aug. 1980, pp. 967–969.

Lee et al., IBM TDB, vol. 22, No. 8B, Jan. 1980, pp. 3630–3634.

Nakajima et al., IEEE International Electron Device Meeting, Technical Digest (Dec. 1984), pp. 240–243.

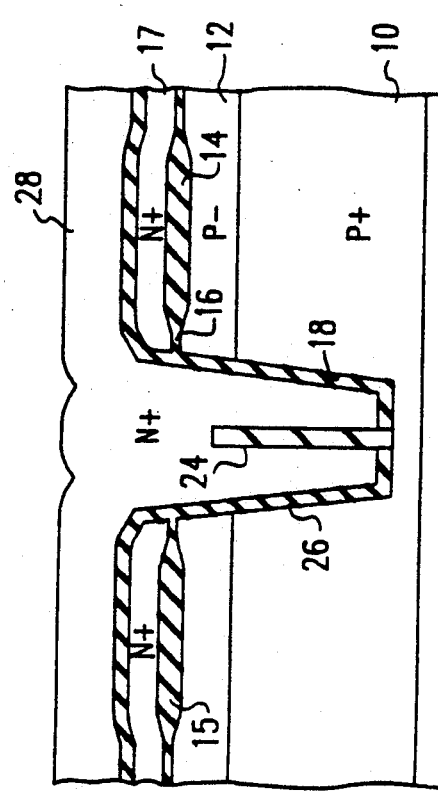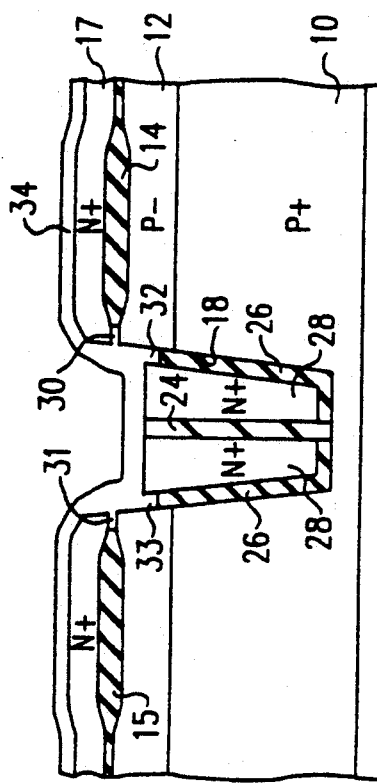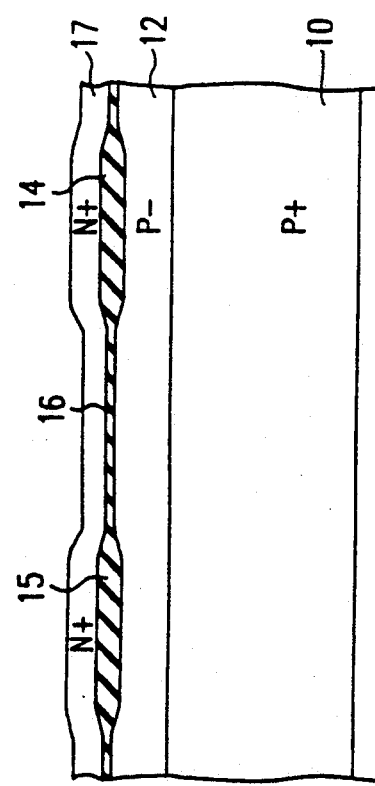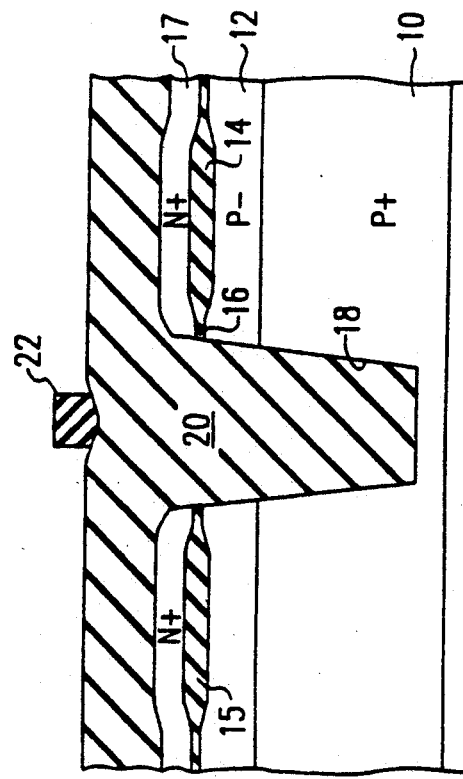
FIG. 1
FIG. 2
FIG. 3
FIG. 4

MULTIPLE DRAM CELLS IN A TRENCH

This application is a continuation of application Ser. No. 07/405,085, now abandoned, filed Sept. 6, 1989 which is a continuation of application Ser. No. 07/099,588 filed Sept. 22, 1987 now abandoned.

TECHNICAL FIELD OF THE INVENTION

The present invention relates in general to semiconductor circuits and methods of fabrication thereof, and more particularly relates semiconductor memory structures and fabrication methods.

BACKGROUND OF THE INVENTION

There exists a continued effort to develop semiconductor memories having greater storage capacities and higher speed capabilities. Accordingly, recent efforts have been directed toward reducing the area required by each storage cell of the memory such that an integrated circuit chip can accommodate a greater number of such cells. Efforts are also directed toward the reduction of the various capacitances associated with the memory cells to enable high-speed electrical read and write operations thereof.

One approach taken to achieve a high density, high-speed dynamic random access memory (DRAM) is through the utilization of the trench technology. With this technique, the DRAM cell, comprising a pass transistor in series with a storage capacitor, is fabricated in a trench with the transistor formed over the capacitor. In this manner, the wafer area per cell is reduced, as the transistor need not be formed at a lateral location on the wafer with respect to the capacitor, as was heretofore a conventional technique. In order to optimize the performance of the trench DRAM cells, the storage capacitance was maintained as large as possible by extending the depth of the trench into the silicon wafer. While deeper trenches make possible larger storage capacitors, an inherent process limitation places a limit on the depth of the trench.

When etching a silicon wafer to form the noted trenches, certain process limitations cause such trenches to be tapered inwardly near the bottom of the trench. Hence, with narrow trenches, which are desirable in fabricating small area cells, the trench sidewalls would converge, or close together, at depths of only several microns below the wafer surface. Thus, efforts to form narrow trenches for further reducing the cell area requirements were counterproductive, in that the capacitance of the storage capacitor was correspondingly decreased, or at least limited.

The noted trench cells were accessed by bitlines diffused into the semiconductor material of the wafer. By utilizing bitlines of the noted construction, the junction capacitance thereof, with respective to the substrate, presented speed limitations for accessing the cells. Also, such cell structure was susceptible to soft errors, in the nature of incorrect electrical cell operation due to alpha particles entering the substrate.

From the foregoing, it can be seen that a need exists for an improved DRAM cell structure, and method of fabrication thereof, which provides a small cell area without compromising the storage capabilities of the storage capacitor. An additional need exists for a memory structure which exhibits reduced wordline capacitance, and a high immunity to alpha particle strikes. An associated need exists for a high density, high-speed DRAM array which can be fabricated by currently available silicon fabrication techniques.

SUMMARY OF THE INVENTION

In accordance with the present invention, the DRAM cell structure and the method of fabrication thereof substantially reduce or eliminate the disadvantages and shortcomings associated with the prior art techniques. According to the invention, a trench is formed in a semiconductor wafer, of whatever width is necessary to achieve the desired depth. In this manner, deeper trenches can be formed for achieving corresponding larger storage capacitors. Because wider trenches may be required, multiple memory cells are formed in each such trench. The technical advantage presented by this technique is that while the lateral area required by the trench may be greater, the overall area required for a given number of DRAM cells is not increased. In addition, the technical advantage is that by removing the limitation on the trench depth, larger cell capacitances are available.

The trench is compartmentalized by an insulator to define the cell locations, and to further provide electrical isolation therebetween. Each cell capacitor occupies a major part of its associated compartment, with a small area vertical pass transistor formed thereover. The pass transistor is fabricated in diagonal corners of the trench, thereby minimizing electrical coupling between neighboring cells.

The wordlines of the memory array are connected to rows of cells by respective small vertical pillars of conductive polysilicon formed down into the trench adjacent the pass transistors. Small area transistors can thus be formed. The wordline pillars thus function as a gate conductor to control the conduction of the pass transistor. The technical advantage of this feature is reduced wordline capacitance.

The bitlines of the DRAM memory array of the invention comprise conductive polysilicon lines extending over field oxide areas which overlie the semiconductor material of the wafer. The technical advantage presented by this aspect is that the field oxide reduces the capacitance between the bitlines and the substrate, thereby enhancing the speed characteristics of the memory. In addition, with the bitlines overlying areas of electrically insulating field oxide, alpha particle strikes in the substrate reduce the electrical effects thereof in the bitlines.

BRIEF DESCRIPTION OF THE DRAWINGS

Further features and advantages will become apparent from the following and more particular description of the preferred embodiment of the invention, as illustrated in the accompanying drawings in which like reference characters generally refer to the same parts, elements or regions throughout the views, and in which:

FIGS. 1-5, 7 and 8 illustrate various sectional views of a semiconductor wafer during the various processing steps in which the fabrication of the DRAM cell of the invention is accomplished;

DETAILED DESCRIPTION OF THE INVENTION

Figure 7:
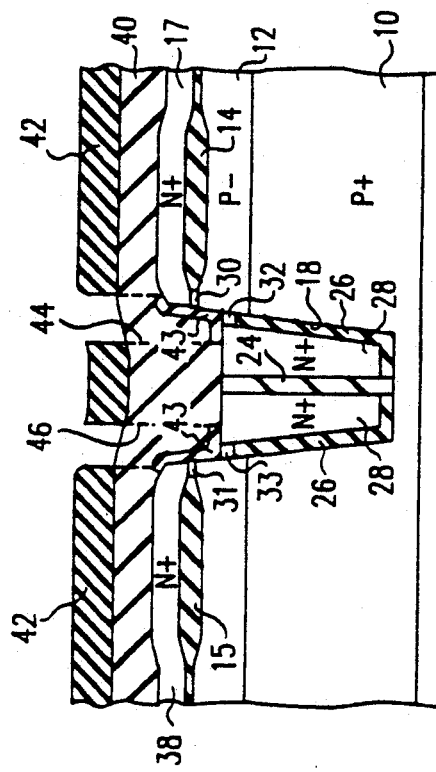

The multiple cell trench embodiment of the invention is described below in an exemplary form having two cells in a single trench. However, with the teachings of the invention as set forth below, those skilled in art can readily adapt the principles and concepts of the invention to accommodate more than two cells per trench. Indeed, with elongate trenches, many cells can be formed in such a trench, each isolated by a lattice or matrix-shaped insulator.

With reference now to FIG. 1, there is depicted a processed semiconductor wafer structure ready for forming the cell trenches therein. Particularly, shown is a heavily doped P+ substrate 10 covered with an epitaxial layer 12 which is more lightly doped. The P+ substrate 10 can be of a suitable semiconductor material, such as a silicon wafer having a <100> crystallographic orientation, and an impurity concentration of about 1E19 atoms per cm$^3$. The layer 12 of lightly doped semiconductor material may be deposited by epitaxial techniques, and include a concentration of about 1E16-1E17 atoms per cm$^3$. The epitaxial layer 12 can be deposited to a depth of 4-4.5 microns. The depth of the epitaxial layer 12 is related to the channel length of the pass transistor of the cell, as such transistor is formed vertically in the lightly doped layer 12. The lightly doped P-type layer 12 serves to increase the breakdown voltage of the memory cell transistor.

Thick field oxide strips 14 and 15 are then formed over the surface of the wafer by conventional thermal silicon oxidation techniques. The silicon oxide strips 14 and 15 comprise a field oxide, and may be grown to a noncritical thickness of 10,000 angstroms. As noted in FIG. 1, a thin oxide layer 16 connects the field oxide strips 14 and 15 together. The thin oxide 16 may serve as a gate oxide for MOS transistors formed in the peripheral circuits of the memory of the invention. Deposited over the epitaxial layer 12 and field oxide strips 14 and 15 is a layer 17 of polysilicon (polycrystalline silicon) suitably doped to form an electrical conductor. The doped polysilicon layer 17 is patterned by process steps to be described below, and connected to the DRAM cell of the invention to function as a bitline. As can be appreciated, the address, access, decode, clock and other circuits typically required by a semiconductor memory are formed in the periphery of the cell array according to conventional process steps which need not be described here. Moreover, while a typical array embodying the cell structure of the invention may include up to four million cells, or more, only the fabrication of a single pair of such cells is described below.

The wafer structure is shown in FIG. 2 after further processing in which a trench 18 is formed through the various material layers into the underlying P+ substrate 10. The location of the trench 18 is defined by patterning a photoresist layer with a rectangular surface opening of about 4 micron ×4 micron. The wafer is then subjected to an anisotropic etch, such as a plasma reactive ion etch (RIE), to remove the material in the opening, and to remove such material in a vertical direction. As noted, the sidewalls of the trench 18 have an inward taper which is characteristic of the reactive ion etch process. The anisotropic etch process is continued until a trench of about eight microns deep is formed. The capacitance of the storage capacitor is related to the depth of the trench 18, and thus for larger capacitors, deeper trenches can be formed. The depth of the trench is defined herein as that which exists in the P− and P+ substrates 10 and 12. In the preferred embodiment of the invention, about two million such trenches would be formed to realize a 4 Meg DRAM. As to be set forth more fully below, the trenches should be spaced apart sufficiently to reduce electrical interference therebetween, and to accommodate the field oxide strips 14 and 15 therebetween.

A layer 20 of silicon oxide is then deposited over the surface of the array, to a depth sufficient to fill the trench 18. Preferably, a conformal oxide such as TEOS is suitable for such purpose. The electrical insulator layer 20 of silicon oxide is then pattern with a layer of photoresist 22 and anisotropically etched to form a divider across the trench 18 and thereby define a pair of compartments.

FIG. 3 illustrates the insulating divider 24 which defines the compartments and which extends along the longer axis of the rectangular trench 18. As shown, the divider 24 extends to the bottom of the trench in contact with the P+ substrate 10. After etching the conformal oxide 20 to form the divider 24, the photoresist 22 is removed, and the memory array portion of the wafer is cleaned and subjected to a silicon oxidizing ambient for forming a silicon dioxide (SiO$_2$) dielectric layer 26 on the sidewalls and bottom of the trench 18. The dielectric layer 26 comprises the capacitor dielectric, and may be 150-200 angstroms thick.

As further noted in FIG. 3, a layer 28 of heavily doped N+ polysilicon is deposited over the array surface with a thickness sufficient to fill the compartments of the trench 18. The N+ polysilicon material 28 fills each compartment of the trench 18 and provides an inner plate of each cell capacitor. About 1-2 microns of the N+ polysilicon 28 are removed by an appropriate etch, thereby leaving the top surface of the N+ polysilicon material 28 at a vertical location somewhat intermediate the P− epitaxial layer 12. The wafer is then subjected to a wet etch to selectively remove the exposed silicon oxide dielectric 26, without affecting the N+ polysilicon 28. A buffered hydrofluroic (HF) solution is suitable for such a selective oxide etch. As a result of the wet etch, a portion of the thin silicon oxide layer 16 is also removed, forming pockets 30 and 31, as shown in FIG. 4. A pair of pockets 32 and 33 are also formed by the selective wet oxide etch in the capacitor dielectric 26. The purpose of such pocket reliefs 30-33 will be described below in connection with a formation of transistor source and drain regions.

Figure 5:
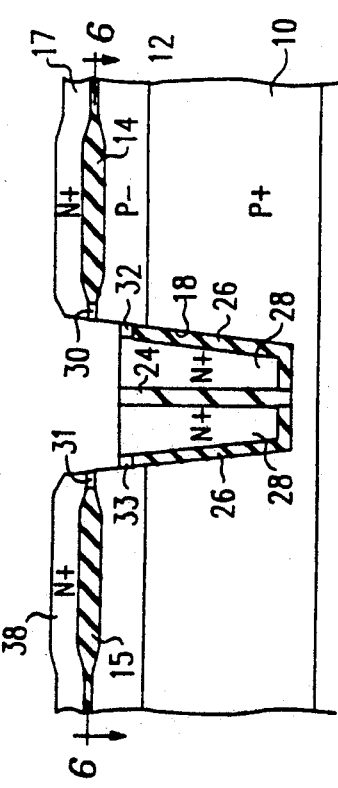

As further shown in FIG. 4, a conformal layer 34 of undoped polysilicon is thereafter deposited over the array surface, to a thickness sufficient to fill the relief pockets 30-33. A wet etch is again utilized to remove substantially all of the deposited undoped polysilicon 34, except that which fills the relief pockets 30-33. FIG. 5 shows the wafer after the removal of the conformal oxide 34, leaving only that which fills the relief pockets 30-33.

Figure 6:
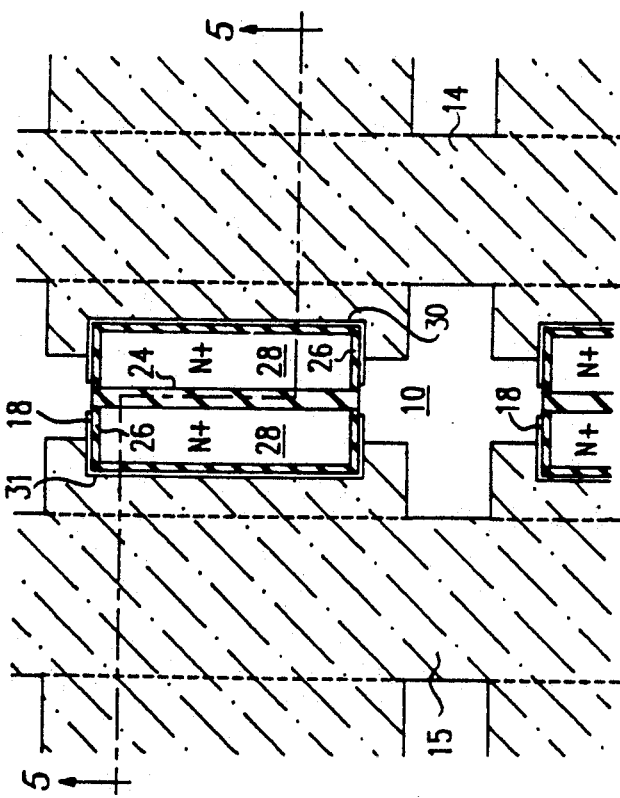
FIG. 6 is a sectional view of the DRAM cell structure of FIG. 5, taken along line 6—6 thereof.

To facilitate the understanding of the trench DRAM cells of the invention, reference is made to FIG. 6 where there is illustrated a simplified cross-section, taken along line 6—6 of FIG. 5. Shown are the two field oxide strips 14 and 15 formed on each side of the trench 18. The trench 18 has formed therein the insulating divider 24 for defining the two compartments, each of which is associated with a DRAM cell. Each compartment is filled with a heavily doped N+ material 28 forming inner plates of the respective capacitors. The capacitor inner plate material 28 is insulated by the capacitor dielectric 26 from the heavily doped P+ substrate material 10, forming the outer plate of the cell capacitor. The P+ substrate 10 surrounds each trench of the array, and thus forms an outer plate common to each cell of the memory array.

Further shown in FIG. 6 are the upper recessed pockets 30 and 31 which subsequently form semiconductor drain regions of the pass transistors of each cell. Importantly, each transistor is formed in the diagonal corners of the respective trench compartments to reduce electric interference therebetween. In addition, the active portion of each cell transistor is formed a short distance away from the corner of the trench 18, thereby avoiding physical and electrical anomolies prevalent in corner semiconductor structures. A pair of bitlines 17 and 38 are shown on each side of the trench. The bitlines 17 and 38 are shown after having been patterned to form the illustrated shape. Such bitline patterning is preferably accomplished before the trenching steps. The connection of the bitlines 17 and 38 to the respective cell transistor drain regions 30 and 31 is described below.

Processing of the wafer continues, as shown in FIG. 7, by depositing a layer 40 of conformal silicon oxide, such as TEOS, to fill the upper portion of the trench 18 with an insulator. The silicon oxide layer 40 is patterned with a photoresist 42 to form a pair of wordline cylinders, as shown in broken lines by reference characters 44 and 46. The openings in the photoresist are small and rectangular in shape, and located near the diagonal corners of the trench to define the active part of each pass transistor. The exposed silicon oxide material 40 is then etched to anisotropically remove the material not underlying the patterned photoresist 42. Importantly, the insulating oxide 40 adjacent the P− epitaxial layer 12 is removed for forming in subsequent steps a gate oxide for the vertical transistors. The photoresist 42 is then removed.

As depicted in FIG. 7, the wafer is next subjected to a silicon oxidizing ambient, wherein a thin layer 43 of silicon oxide is formed on the upper sidewalls of the trench 18. The thin silicon oxide 43 is grown to a thickness of about 250 angstroms and functions as a gate insulator of the MOS pass transistor of each DRAM cell.

Figure 8:
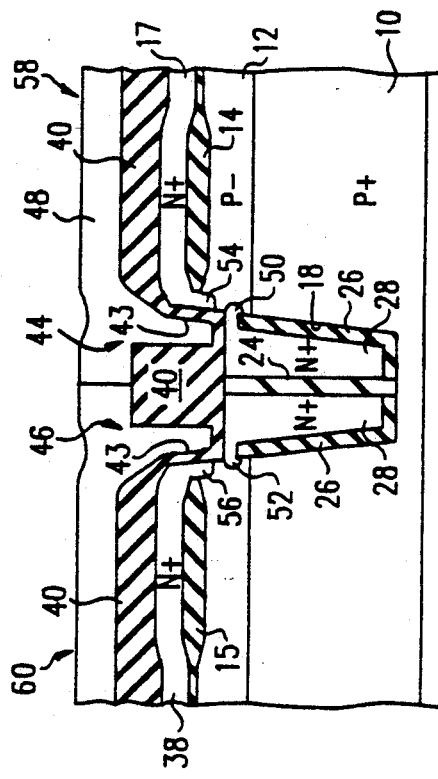

With reference to FIG. 8, the conformal oxide layer 40 is shown with the cylinder opening locations 44 and 46. A layer 48 of N. doped polysilicon is next deposited over the array surface, to a depth sufficient for filling the cylinder openings 44 and 46 to form pillars of conductive polysilicon. The polysilicon 48 is doped with an N-type impurity to a sufficient concentration to provide an electrically conductive material. As noted, above, the conductive polysilicon pillars are located proximate diagonal corners of the trench 18. The pillars 44 and 46 of conductive polysilicon function as gate conductors for each vertical pass transistor of each cell formed within the respective compartments of the trench 18.

In accordance with another feature of the invention, the wafer is placed in a high temperature ambient to anneal and activate the various impurities. Specifically, the N+ impurities of the N+ capacitor plate material 28 are caused to diffuse outwardly through the lower recessed pockets 32 and 33, forming respective buried lateral contacts 50 and 52. Such N+ semiconductor regions 50 and 52 form respective source regions of the pass transistors. At the same time, the N-type impurities of the polysilicon bitlines 17 and 38 diffuse into the respective upper recess pockets 30 and 31, thereby forming semiconductor drain regions 54 and 56 of the vertical pass transistors. The P− material 12 between the respective source and drain regions defines a conduction channel for each such pass transistor. Only a small region of the noted transistor conduction channels becomes inverted during transistor conduction, as the gate conductor pillars are narrow, and thus an electric field is applied to only a small section of the P− material to form an inverted conductive channel. With a small active pass transistor region, the capacitance is reduced and higher speed address signals can be applied to the cell transistors.

The trench transistor cell of the invention is written and read, as follows. In performing a write operation of the rightmost cell of FIG. 8, in which a charge is stored on the N+ capacitor plate 28, the access circuit (not shown) allows the wordline 58 to be driven with a wordline voltage, such as five volts. Such a voltage is effective to apply an electrical field through the gate oxide 36, thereby inverting a small section of the lightly doped P− material 12 between the transistor source and drain regions 50 and 54. The transistor is thus driven into conduction, thereby electrically connecting the bitline 17 to the inner capacitor plate 28. If the bitline is precharged to a logic high level, such charge is transferred to the N+ material 28 forming the inner capacitor plate of the rightmost cell. On the other hand, if the bitline 17 is precharged to a logic low level, little or no charge will be transferred to the inner plate 28 of the capacitor.

The read operation of the cell is substantially identical to the write operation, except that external sense amplifiers (not shown) are connected to the bitline 16 to detect whether or not the storage capacitor has been previously charged. If previously charged, the charge therein will be transferred from the inner capacitor plate 28 through the pass transistor to the bitline 17. Such charge will be sensed by a sense amplifier and converted into a signal of conventional logic level. In the preferred form of the invention, the outer common capacitor plate, or P+ substrate 10, is connected to a potential of about 2.5 volts.

The read and write operation of the leftmost cell within the trench 18 is accomplished by accessing the wordline 60, and sensing the stored charge on the bitline 38. The theory of operation of trench transistors is detailed in a technical article "A Model For The Trench Transistor," by Banerjee et al., *IEEE Transactions On Electron Devices*, August, 1987, the disclosure of which is incorporated herein by reference.

With reference again to FIG. 8, it can be seen that the bitlines 16 and 38 are formed overlying thick field oxide areas 14 and 15. This is in contrast with other memory structures, in which the bitlines were diffused directly into the underlying semiconductor material. With the bitline structure of the invention, the field oxide strips 14 and 15 function as an insulator between a major portion of the respective bitlines 17 and 38 and the lightly doped semiconductor layer 12. Thus, any alpha particles which may enter the semiconductor layer 12 are less likely to produce an electrical effect on the precharged nature of the bitlines 17 and 38. The soft error rate of a DRAM constructed according to the invention is thereby reduced. Accordingly, the reliability of the memory is improved over dynamic random access memories heretofore known.

In addition to the foregoing, with the bitlines 17 and 38 insulated from the underlying P-type semiconductor layer 12, the junction capacitance therebetween is significantly reduced. With less bitline capacitance, a substantial amount of charge which may be stored in the cell capacitor can be transferred to the sensing circuits, and not lost through parasitic capacitances of the bitlines. Also, the speed characteristics of the memory cell are enhanced.

Figure 9:
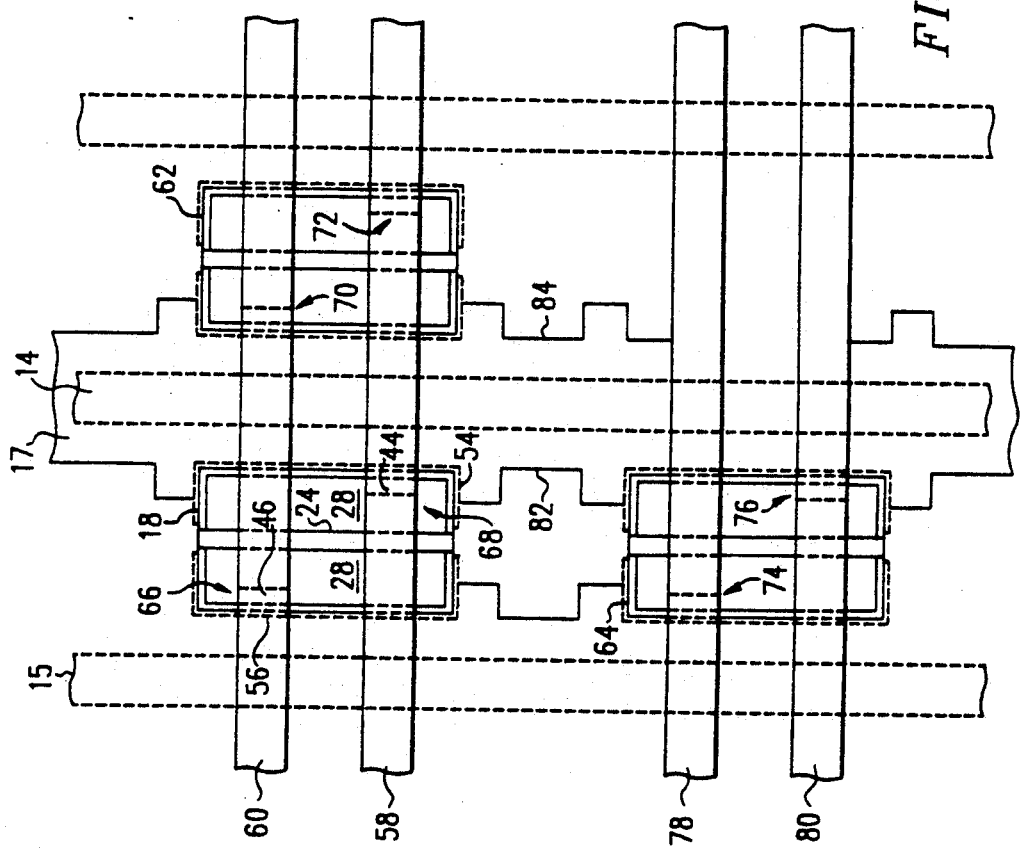
FIG. 9 is a top layout view of multiple trench memory cells of the invention.

FIG. 9 illustrates a top layout view of six DRAM cells of the invention, formed in the respective three trenches 18, 62 and 64. The pass transistors are identified as reference characters 66-76. The trench structure described in detail above is formed with two memory cell transistors 66 and 68, each associated with a different wordline 60 and 58. In like manner, a neighboring trench 62 has formed therein memory cell transistors 70 and 72. The pass transistors 70 and 72 are also associated with the respective wordlines 66 and 58. The trench structure 64, having memory cell transistor pairs 74 and 76 are driven by another pair of wordlines 78 and 80. It is important to understand that the noted wordlines are adapted for driving many other trench structure cells of the array.

In accordance with an important feature of the invention, the bitline 17 is common to memory cell trench structure transistors 68, 70 and 76, as well as other trench cell transistors not shown. As can be seen, the bitline 17 overlies a major portion of the thick field oxide strip 14, thus reducing the capacitor thereof, as noted above. In addition, the bitline 17 includes notches, such as 82 and 84, formed therein at locations between neighboring cells. The bitline material at such notched locations is unnecesssary to the operation of the various memory cells, and thus the bitline is patterned so as not to overly the underlying semiconductor material 12 at such locations. This aspect further reduces the capacitance of the bitline 17 and allows for higher speed operation of the memory. All bitlines of the exemplary memory array are fabricated in a comparable manner.

As can also be appreciated from FIG. 9, the wordline pillars 46 and 44 associated with the pass transistors 66 and 68 are small in cross-section, thereby reducing the wordline capacitance. As a result of reduced wordline capacitance, the various memory cells of the invention can be accessed by higher speed address signals.

From the foregoing, a multiple trench cell transistor structure has been disclosed, which structure provides decided advantages over other trench cells memories known in the art. A technical advantage of the present invention is that with multiple cells in a single trench, such trenches can be formed larger and deeper and thereby provide increased storage capabilities of the cell capacitors. Another technical advantage of the invention is that with the conductive bitlines overlying insulating oxide strips, the capacitance of such bitlines is reduced. As a result, not only are the speed characteristics of the memory improved, but also the soft error rate thereof, due to alpha particle strikes. Yet another technical advantage presented by the invention is that with small wordline pillars connecting the conductive wordlines to the pass transistors of each cell, the capacitance thereof is decreased, also improving the speed characteristics of the memory.

Although the invention has been illustrated and described in what is conceived to be the most practical and preferred embodiment, it is recognized that departures may be made therefrom within the scope of the invention, which are not to be limited to the details disclosed herein, but are to be accorded the full scope of the claims so as to embrace any and all equivalent devices, apparatus and functions.

What is claimed is:

1. A semiconductor trench memory cell structure, comprising:
    (a) a semiconductor substrate having a trench formed therein;
    (b) an electrical insulator for dividing said trench into plural compartments each of said compartments having a selected length and width dimension;
    (c) a capacitor dielectric formed on the sidewalls and bottom of each said trench compartments;
    (d) a doped semiconductor material deposited in each of said trench compartments to thereby form plural storage capacitors, said deposited semiconductor material defining an inner capacitor plate an outer capacitor plate defined by said semiconductor substrate material, and said inner and outer capacitor plates being electrically insulated by said capacitor dielectric and extending the full length dimension of said compartment; and
    (e) a vertical pass transistor formed above each said capacitor, and an active portion of each said vertical pass transistor formed on a portion of and spaced from the end points of a single sidewall of said trench, each said vertical pass transistor including a semiconductor source region formed in said substrate outside of said trench and electrically connected to said inner capacitor plate, a vertical conduction channel region formed in said semiconductor substrate and along a portion of said sidewall of said trench, a drain region formed in said semiconductor substrate and spaced vertically from said source region by said conduction channel region, said vertical conducting channel region having a width which is less than half of said width of said compartment, and a gate insulator formed on the sidewall of said trench and formed adjacent said conduction channel region thereby providing plural memory cells in a single trench.

2. The trench memory cell structure of claim 1, wherein said substrate comprises a heavily doped semiconductor layer and a lightly doped semiconductor layer, said trench being formed in both said layers, and wherein said transistor source and drain regions are formed in said lightly doped semiconductor region.

3. The trench memory cell structure of claim 1, wherein each said transistor includes a gate insulator and a gate conductor formed vertically within said trench.

4. The trench memory cell structure of claim 1, wherein said trench is substantially a four sided polygon and each said transistor is formed adjacent but not in contact with a corner of said trench.

5. The trench memory cell structure of claim 4, wherein each said transistor is spaced a small distance from a respective said trench corner.

6. The trench memory cell structure of claim 1, further including a pair of bitlines, each connected to a different said transistor.

7. The trench memory cell structure of claim 6, wherein each said bitline overlies an insulating strip for electrically insulating at least a portion of said bitlines from said substrate.

8. The trench memory cell structure of claim 7, wherein each said bitline includes a recessed area at locations not overlying said insulating strip.

9. The trench memory cell structure of claim 1, further including a pair of wordlines, each associated with and connected to a different said transistor, and each said bitline including a pillar of conductive material extending into said trench and functioning as a gate conductor of a respective said transistor.

10. The trench memory cell structure of claim 1, further including in combination a plurality of said trench memory cell structures connected together by a plurality of bitlines and a plurality of wordlines to thereby form a memory array.

11. The trench memory cell structure of claim 10, further including in combination access and decode circuits peripheral to said array to thereby form a random access memory.

12. A semiconductor trench memory cell structure, comprising:
   (a) semiconductor substrate defining a trench of a selected length and width dimension;
   (b) an electrical insulator for dividing said trench into plural compartments each of said compartments having said selected length dimension and a width dimension less than said selected width dimension;
   (c) a capacitor dielectric formed on the sidewalls and bottom of each said trench compartments;
   (d) a doped semiconductor material deposited in each of said trench compartments to thereby form plural storage capacitors, said deposited semiconductor material defining an inner capacitor plate, an outer capacitor plate defined by said semiconductor substrate material, and said inner and outer capacitor plates being electrically insulated by said capacitor dielectric and extending the full length dimension of said trench;
   (e) a vertical pass transistor associated with each said capacitor, an active portion of each said transistor being formed on a portion of and spaced from the end points of a single sidewall of said trench and including a semiconductor source region formed in said substrate outside of said trench and electrically connected to said inner capacitor plate;
   (f) a vertical transistor conduction channel region formed in said semiconductor substrate and along a portion of said sidewall of said trench, a semiconductor drain region formed in said and spaced vertically from said source region by said conduction channel region;
   (g) a gate insulator formed on the sidewall of said trench and formed adjacent said conduction channel region;
   (h) a pair of conductive polycrystalline silicon bitlines, each connected to a respective transistor drain region;
   (i) an insulator formed between each said bitline and said semiconductor substrate so as to reduce the capacitance between said bitline and said substrate; and
   (j) a conductive polycrystalline silicon wordline located above said bitline and having a conductive pillar, said pillar extending into said trench and forming a respective gate conductor of respective said transistor.

13. The trench memory cell structure of claim 12, wherein said semiconductor substrate comprises a first conductivity type semiconductor material, and said inner capacitor plate comprises a second conductivity type semiconductor material.

14. The trench memory cell structure of claim 12, wherein each said semiconductor source, each said semiconductor drain and said polycrystalline silicon bitline includes an impurity of said second conductivity type.

15. The trench memory cell structure of claim 12, wherein said trench is rectangular-shaped and is divided into two substantially equal compartments by said insulator extending between a pair of parallel sides of said rectangle, and a transistor is formed in each of said compartments adjacent opposing corners of said trench.

16. The trench memory cell structure of claim 12, wherein said substrate comprises a heavily doped layer and a lightly doped layer, and wherein said heavily doped layer comprises said outer capacitor plate.

17. The trench memory cell structure of claim 16, wherein a portion of said transistor is formed in said lightly doped layer.

* * * * *